United States Patent
Yasuda et al.

[11] Patent Number: 5,936,443
[45] Date of Patent: Aug. 10, 1999

[54] POWER-ON RESET SIGNAL GENERATOR FOR SEMICONDUCTOR DEVICE

[75] Inventors: Kenichi Yasuda; Kiyohiro Furutani; Tsukasa Ooishi; Hideto Hidaka, all of Tokyo, Japan

[73] Assignee: Mitsubishi Denki Kabushiki Kaisha, Tokyo, Japan

[21] Appl. No.: 08/675,202

[22] Filed: Jul. 3, 1996

[30] Foreign Application Priority Data

Nov. 28, 1995 [JP] Japan ................................ 7-309616

[51] Int. Cl.⁶ .................................................. H03K 17/22
[52] U.S. Cl. ........................................... 327/143; 327/198
[58] Field of Search ..................................... 327/142, 143, 327/198

[56] References Cited

U.S. PATENT DOCUMENTS

| 4,818,904 | 4/1989 | Kobayashi | 327/143 |
| 5,155,384 | 10/1992 | Ruetz | 327/143 |
| 5,214,316 | 5/1993 | Nagai | 327/143 |
| 5,319,601 | 6/1994 | Kawata et al. | 327/143 |
| 5,469,099 | 11/1995 | Konishi | 327/143 |
| 5,519,347 | 5/1996 | Kim | 327/143 |

FOREIGN PATENT DOCUMENTS

| 5-136672 | 6/1993 | Japan | 327/143 |

*Primary Examiner*—Kenneth B. Wells
*Attorney, Agent, or Firm*—McDermott, Will & Emery

[57] ABSTRACT

A power-on-reset signal is generated at a proper timing according to an object to which the power-on-reset signal is sent. A POR signal generating circuit for generating the power-on-reset signal is caused to operate with the voltage of an internal voltage generating circuit.

12 Claims, 10 Drawing Sheets

POWER-ON RESET SIGNAL GENERATOR FOR SEMICONDUCTOR DEVICE

BACKGROUND OF THE INVENTION

1. Field of the Invention

The present invention relates to a semiconductor device comprising a semiconductor chip on which an internal voltage generating circuit is provided, and more particularly to a semiconductor device comprising a reset signal generating circuit for generating a power-on-reset signal (hereinafter referred to as a POR signal) used for resetting an internal circuit thereof when a power source is turned ON or for keeping circuit operation halted until an internal potential is stabilized in order to prevent the unstable state from occurring when the power source is turned ON.

2. Description of the Background Art

In some cases, the semiconductor device has a structure in which the internal circuit is reset when the power source is turned ON or the circuit operation is kept halted until the internal potential is stabilized by using the POR signal in order to prevent the unstable state from occurring when the power source is turned ON.

FIG. 25 is a block diagram showing the structure of a semiconductor device which comprises a conventional POR signal generating circuit for generating a POR signal. In FIG. 25, reference numeral 1 designates a semiconductor chip, 2 designates a power input terminal provided on the semiconductor chip 1 for receiving an external voltage ExVdd given from the outside of the semiconductor chip 1, 3 designates an internal circuit provided in the semiconductor chip 1, 4 designates an internal voltage generating circuit for supplying an internal voltage intVdd to the internal circuit 3, and 5 designates a POR signal generating circuit for generating a POR signal to be sent to the internal circuit 3 based on the external voltage ExVdd.

FIG. 26 is a circuit diagram showing the structure of a POR circuit. In FIG. 26, reference numeral 6 designates an N channel MOS transistor having a gate to which the external voltage ExVdd is given, a drain to which the external voltage ExVdd is given, and a source, 7 designates a capacitor having a first end connected to the source of the transistor 6 and a second end connected to a ground potential point GND, 8 designates an N channel MOS transistor having a gate to which the external voltage ExVdd is given, a drain to which the external voltage ExVdd is given, and a source, 9 designates an N channel MOS transistor having a drain connected to the source of the transistor 8, a source connected to the ground potential point GND, and a gate connected to the first end of the capacitor 7, 10 designates an inverter having an input terminal connected to the drain of the transistor 9 and an output terminal for inverting and outputting the logic of a signal input to the input terminal, and 11 designates an inverter having an input terminal connected to the output terminal of the inverter 10 and an output terminal for inverting and outputting the logic of a signal input to the input terminal.

A pulse signal is output as the POR signal from the conventional POR signal generating circuit. The pulse width of the POR signal is determined by the charging time of the capacitor 7 because the conventional POR signal generating circuit has the above structure. However, the conventional POR signal generating circuit has problems that the POR signal is generated depending on the rise speed of an external power source before the internal voltage generating circuit fully operates and that the POR signal is generated by the change of the external voltage.

It is preferred that POR signals outputted on different timings are generated depending on a circuit structure in some cases, for example, in the case where a plurality of internal voltage generating circuits are provided on the semiconductor chip and the internal voltages have different generation timings. In the case of a DRAM, a plurality of potentials such as a substrate potential Vbb, a cell plate potential Vcp and the like are necessary. According to the semiconductor chip in which the external voltage ExVdd is dropped inside and the internal voltage intVdd is used, the cell plate potential Vcp is often generated by the internal voltage intVdd when the ground potential GND acts as a reference in consideration of the stability of the potential. A coupling capacity between a cell plate and a substrate is big. Consequently, the floating of the substrate potential Vbb may be caused by the coupling capacity when the cell plate potential Vcp rises. In order to prevent the floating, it is preferred that the substrate potential Vbb is kept fixed to the ground potential GND until the cell plate potential Vcp rises.

However, the POR signal generating circuit according to the prior art has the following problems. More specifically, the POR signal is generated by only the external voltage. For this reason, it is hard to generate signals which rise (or fall) at different timings, that is, at a comparatively early timing as the POR signal of the internal voltage generating circuit, and a signal which rises (or falls) after the cell plate potential Vcp is stabilized, that is, at a comparatively late timing as the POR signal of the internal voltage generating circuit used for setting the substrate potential Vbb.

SUMMARY OF THE INVENTION

A first aspect of the present invention is directed to a semiconductor device comprising an internal circuit provided in a semiconductor chip, a power input terminal provided on the semiconductor chip for receiving an external voltage given from the outside of the semiconductor chip, an internal voltage generating circuit provided in the semiconductor chip and connected to the power input terminal for generating an internal voltage to be supplied to the internal circuit based on the external voltage, and a first reset signal generating circuit provided in the semiconductor chip for generating a first reset signal in response to the internal voltage to reset the internal circuit or to keep circuit operation halted until a predetermined state is obtained.

A second aspect of the present invention is directed to the semiconductor device according to the first aspect of the present invention, wherein the internal circuit comprises a first circuit unit for operating with the internal voltage, and a second circuit unit for operating with the external voltage, the first and second circuit units being reset or circuit operation being kept halted until a predetermined state is obtained with the first reset signal.

A third aspect of the present invention is directed to the semiconductor device according to the first aspect of the present invention, further comprising a second reset signal generating circuit provided in the semiconductor chip for generating a second reset signal in response to the external voltage to reset the internal circuit or to keep circuit operation halted until a predetermined state is obtained, wherein the internal circuit comprises a first circuit unit for operating with the internal voltage, and a second circuit unit for operating with the external voltage, the first circuit unit being reset or circuit operation being kept halted until a predetermined state is obtained with the first reset signal, and the second circuit unit being reset or circuit operation being kept halted until a predetermined state is obtained with the second reset signal.

A fourth aspect of the present invention is directed to the semiconductor device according to the first aspect of the present invention, wherein the internal voltage generating circuit comprises first and second internal voltage generating circuits for respectively generating first and second internal voltages which are different from each other, the first reset signal generating circuit comprises a second reset signal generating circuit provided in the semiconductor chip for generating a second reset signal in response to the first internal voltage to reset the internal circuit or to keep circuit operation halted until a predetermined state is obtained, and a third reset signal generating circuit provided in the semiconductor chip for generating a third reset signal in response to the second internal voltage to reset the internal circuit or to keep circuit operation halted until a predetermined state is obtained, wherein the internal circuit comprises a first circuit unit for operating with the first internal voltage, and a second circuit unit for operating with the second internal voltage, the first circuit unit being reset or circuit operation being kept halted until a predetermined state is obtained with the second reset signal, and the second circuit unit being reset or circuit operation being kept halted until a predetermined state is obtained with the third reset signal.

A fifth aspect of the present invention is directed to the semiconductor device according to the first aspect of the present invention, wherein the internal voltage generating circuit comprises first and second internal voltage generating circuits for generating first and second internal voltages which are different from each other, and the first reset signal generating circuit generates the first reset signal according to the first internal voltage, wherein the internal circuit comprises a first circuit unit for operating with the first internal voltage, and a second circuit unit for operating with the second internal voltage, the first and second circuit units being reset or circuit operation being kept halted until a predetermined state is obtained with the first reset signal.

A sixth aspect of the present invention is directed to the semiconductor device according to any of the first to fifth aspects of the present invention, further comprising an internal power source reset signal generating circuit provided in the semiconductor chip for generating an internal power source reset signal in response to the external voltage, the internal voltage generating circuit being reset or circuit operation being kept halted until a predetermined state is obtained with the internal power source reset signal.

A seventh aspect of the present invention is directed to the semiconductor device according to the first aspect of the present invention, further comprising a lower rank internal voltage generating circuit provided in the semiconductor chip for generating a lower rank internal voltage used in an internal circuit based on an internal voltage given from the internal voltage generating circuit, and a lower rank reset signal generating circuit provided in the semiconductor chip for generating a lower rank reset signal in response to the lower rank internal voltage to reset the internal circuit or keep circuit operation halted until a predetermined state is obtained.

An eighth aspect of the present invention is directed to the semiconductor device according to any of the first to seventh aspects of the present invention, wherein the first reset signal generating circuit generates the first reset signal in response to the external voltage and the internal voltage.

A ninth aspect of the present invention is directed to the semiconductor device according to any of the first to seventh aspects of the present invention, wherein the internal voltage generating circuit comprises first and second internal voltage generating circuits for generating first and second internal voltages which are different from each other, the first reset signal generating circuit generating the first reset signal which takes the shape of a pulse having leading and trailing edges according to the first and second internal voltages.

A tenth aspect of the present invention is directed to the semiconductor device according to any of the first to ninth aspects of the present invention, wherein the first reset signal generating circuit comprises comparing means for comparing the voltages of predetermined two nodes in the internal voltage generating circuit, and reset signal generating means for generating the first reset signal in response to the results of comparison obtained by the comparing means.

An eleventh aspect of the present invention is directed to the semiconductor device according to any of the first to tenth aspects of the present invention, wherein the first reset signal generating circuit generates the first reset signal in response to a reference voltage generated in the internal voltage generating circuit or a voltage output from a circuit having the same structure as that of the internal voltage generating circuit in which the reference voltage is generated.

A twelfth aspect of the present invention is directed to the semiconductor device according to the tenth aspect of the present invention, wherein the comparing means comprises a first transistor of a first conductivity type having a first current electrode connected to a first power potential point, a control electrode connected to a first input terminal, and a second current electrode, a second transistor of the first conductivity type having a control electrode connected to the first input terminal, a first current electrode connected to the second current electrode of the first transistor, and a second current electrode, a third transistor of the first conductivity type having a first current electrode connected to the second current electrode of the first transistor, a control electrode connected to a second input terminal, and a second current electrode, a fourth transistor of a second conductivity type having a first current electrode connected to a second power potential point, a control electrode, and a second current electrode connected to the second current electrode of the first transistor, a fifth transistor of the second conductivity type having a first current electrode connected to the second power potential point, a control electrode connected to the second current electrode of the fourth transistor, a control electrode, and a second current electrode connected to the second current electrode of the second transistor, a sixth transistor of the second conductivity type having a first current electrode connected to the control electrode of the fourth transistor, a second current electrode connected to the control electrode of the fifth transistor, and a control electrode, a seventh transistor of the second conductivity type having a first current electrode connected to the control electrode of the fourth transistor, a control electrode, and a second current electrode connected to the second current electrode of the third transistor, a first inverter having an input terminal connected to the second current electrode of the third transistor, and an output terminal, a second inverter having an input terminal connected to the output terminal of the first inverter, and an output terminal connected to the control electrode of the sixth transistor, and a third inverter having an input terminal connected to the output terminal of the second inverter, and an output terminal connected to the control electrode of the seventh transistor, wherein the results of comparison are output from the output terminal of the second inverter A thirteenth aspect of the present invention is directed to a comparing circuit comprising a first transistor of a first conductivity type having a first current electrode connected to a first power potential point, a control electrode connected to a first input terminal, and a second current electrode, a second transistor of the first conductivity type having a control electrode connected to the first input terminal, a first current electrode connected to the second current electrode of the first transistor, and a second current electrode, a third transistor of the first conductivity type having a first current electrode connected to the second current electrode of the first transistor, a control electrode connected to a second input terminal, and a second current electrode, a fourth transistor of a second conductivity type having a first current electrode connected to a second power potential point, a control electrode, and a second current electrode connected to the second current electrode of the first transistor, a fifth transistor of the second conductivity type having a first current electrode connected to the second power potential point, a control electrode connected to the second current electrode of the fourth transistor, and a second current electrode connected to the second current electrode of the second transistor, a sixth transistor of the second conductivity type having a first current electrode connected to the control electrode of the fourth transistor, a second current electrode connected to the control electrode of the fifth transistor, and a control electrode, a seventh transistor of the second conductivity type having a first current electrode connected to the control electrode of the fourth transistor, a control electrode, and a second current electrode connected to the second current electrode of the third transistor, a first inverter having an input terminal connected to the second current electrode of the third transistor, and an output terminal, a second inverter having an input terminal connected to the output terminal of the first inverter, and an output terminal connected to the control electrode of the sixth transistor, and a third inverter having an input terminal connected to the output terminal of the second inverter, and an output terminal connected to the control electrode of the seventh transistor, wherein the results of comparison are output from the output terminal of the second inverter.

In order to solve the above problems, it is an object of the present invention to generate a stable POR signal which is hardly influenced by the change of an external voltage.

It is another object of the present invention to provide a semiconductor device which can perform resetting or halt circuit operations of circuits at different timings.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
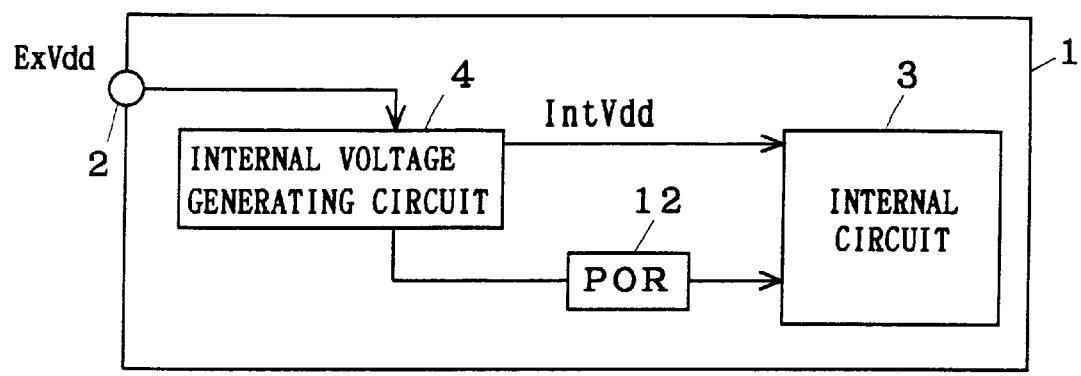
FIG. 1 is a block diagram showing the structure of a semiconductor device according to a first embodiment of the present invention.

FIG. 1 is a block diagram showing the structure of a semiconductor device according to a first embodiment of the present invention. In FIG. 1, reference numeral 1 designates a semiconductor chip, 2 designates a power input terminal provided on the semiconductor chip 1 for receiving an external voltage ExVdd given from the outside of the semiconductor chip 1, 3 designates an internal circuit provided in the semiconductor chip 1, 4 designates an internal voltage generating circuit for supplying an internal voltage intVdd to the internal circuit 3, and 12 designates a POR signal generating circuit for generating a POR signal to be sent to the internal circuit 3 based on the internal voltage intVdd.

The POR signal is generated based on the internal voltage intVdd. Consequently, the POR signal can be generated after the internal voltage intVdd is stabilized. In addition, the malfunction of the POR signal generating circuit caused by the fluctuation of the external voltage ExVdd can also be reduced.

A method for causing the POR signal generating circuit to operate with the internal voltage intVdd and a method for detecting the change of the internal voltage intVdd are worked out as a method for generating the POR signal based on the internal voltage intVdd. The structures for implementing these methods will be described below.

Figure 11:
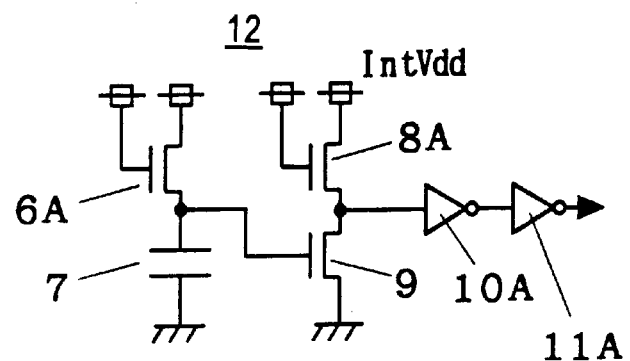
FIG. 11 is a circuit diagram showing a first mode of the structure of a POR signal generating circuit.

FIG. 11 is a circuit diagram showing the structure of the POR signal generating circuit 12 in FIG. 1. In FIG. 11, reference numeral 6A designates an N channel MOS transistor having a gate to which an internal voltage intVdd is given, a drain to which the internal voltage intVdd is given, and a source, 7 designates a capacitor having a first end connected to the source of the transistor 6A and a second end connected to a ground potential point GND, 8A designates an N channel MOS transistor having a gate to which the internal voltage intVdd is given, a drain to which the internal voltage intVdd is given, and a source, 9 designates an N channel MOS transistor having a drain connected to the source of the transistor 8A, a source connected to the ground potential point GND, and a gate connected to the first end of the capacitor 7, 10A designates an inverter having an input terminal connected to the drain of the transistor 9 and an output terminal for inverting and outputting the logic of a signal input to the input terminal, and 11A designates an inverter having an input terminal connected to the output terminal of the inverter 10 and an output terminal for inverting and outputting the logic of a signal input to the input terminal. The inverters 10A and 11A operate on receipt of the supply of the internal voltage intVdd.

Figure 12:
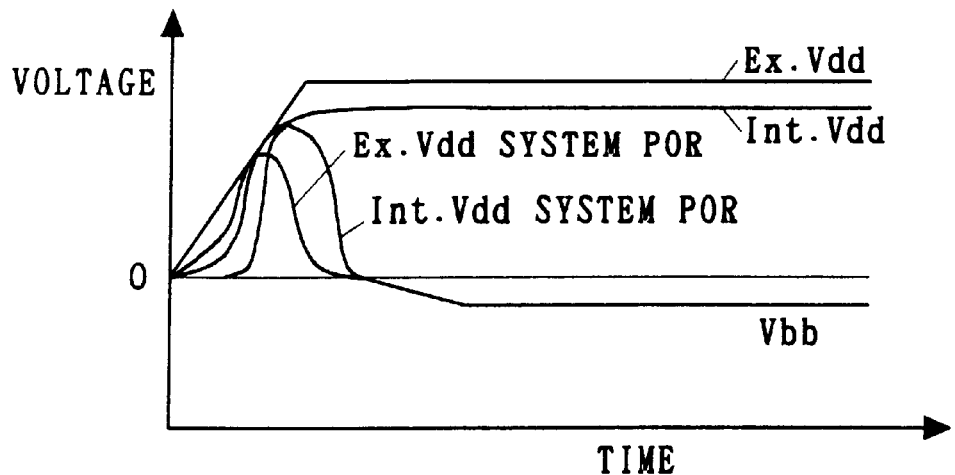
FIG. 12 is a wave form chart showing the operation of the circuit shown in FIG. 11.
Figure 25:
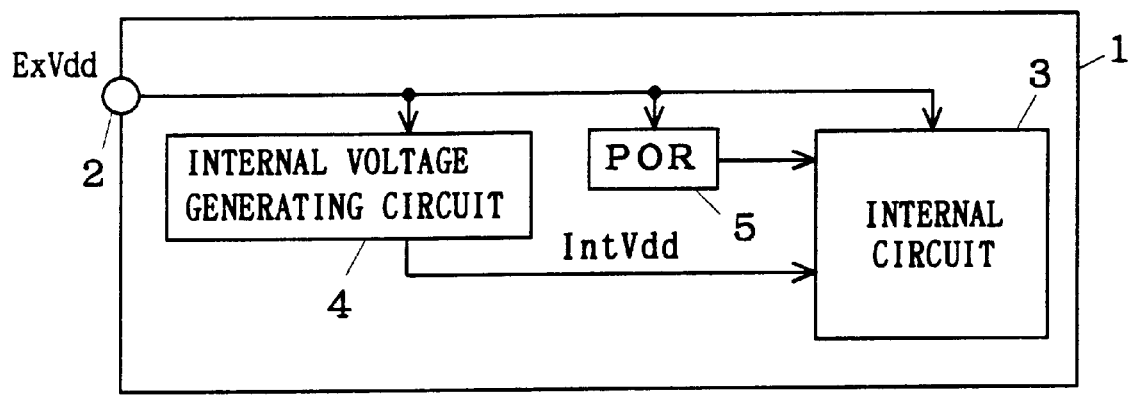
FIG. 25 is a block diagram showing the structure of a conventional semiconductor device.
Figure 26:
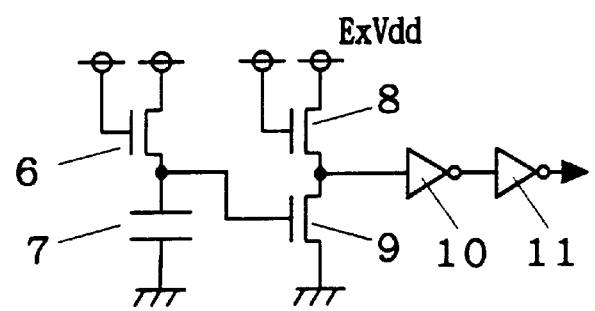
FIG. 26 is a circuit diagram showing the structure of a conventional POR signal generating circuit.

FIG. 12 is a wave form chart showing a difference in operation between the POR signal generating circuit 5 in FIG. 25 and the POR signal generating circuit 12 in FIG. 11. As shown in FIG. 12, the external voltage ExVdd is higher than the internal voltage intVdd. As a matter of course, it is apparent that the external voltage ExVdd rises earlier than the internal voltage intVdd on an origin where a power source is turned ON. Referring to the conventional POR signal generating circuit 5 which operates with the external voltage ExVdd shown in FIG. 25, the POR signal (indicated at ExVdd system POR in FIG. 12) output from the conventional POR signal generating circuit 5 sometimes rises earlier than the internal voltage intVdd depending on the setting of the capacitor 7 as shown in FIG. 12. On the other hand, the POR signal output from the POR signal generating circuit 12 for operating on receipt of the internal voltage intVdd (indicated at intVdd system POR in FIG. 12) always rises later than the internal voltage intVdd. For this reason, the internal circuit 3 is not reset, or is not started by the internal voltage generating circuit 4 in the unstable state so that the POR signal can be generated with the internal voltage intVdd stable easily. Furthermore, the POR signal generating circuit 12 is caused to operate with the internal voltage intVdd. Consequently, even if the external voltage ExVdd fluctuates, the POR signal is not generated while the internal voltage intVdd is in the stable state. Thus, a malfunction can be prevented from occurring.

A second mode of the POR signal generating circuit 12 will be described below with reference to FIGS. 14 and 15.

Figure 14:
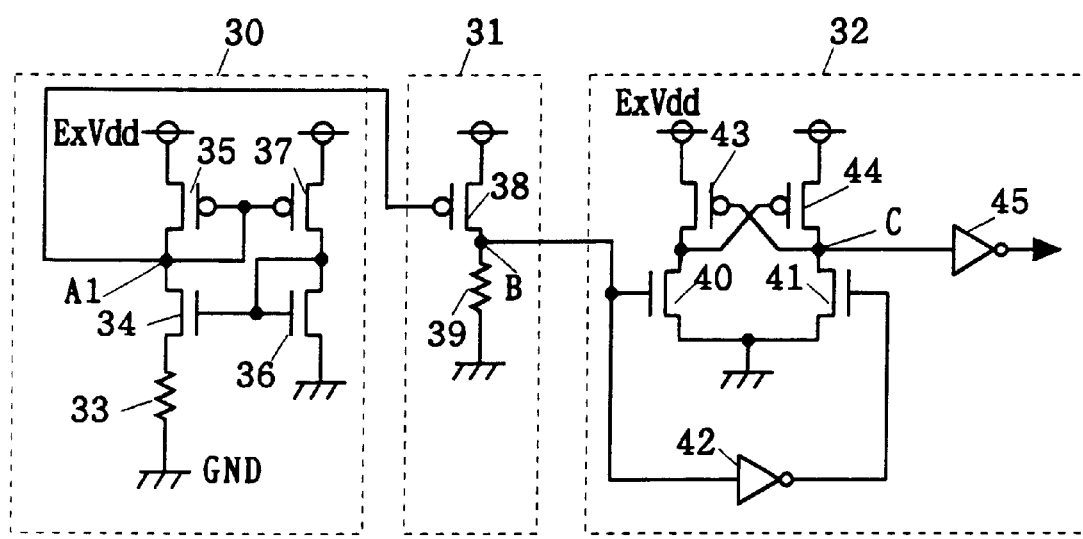
FIG. 14 is a circuit diagram showing a second mode of the structure of the POR signal generating circuit.
Figure 15:
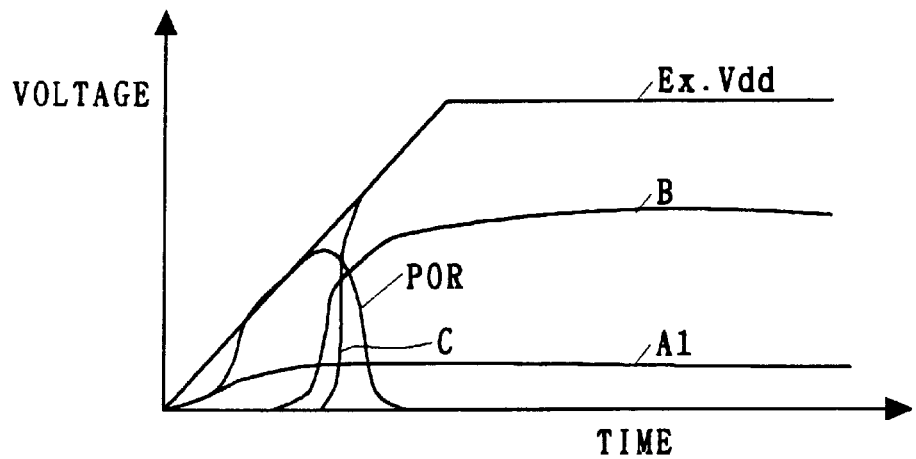
FIG. 15 is a wave form chart showing the operation of the circuit shown in FIG. 14.

The POR signal generating circuit shown in FIG. 14 does not take the generation timing of the POR signal with the time constant of the capacitor but detects that a reference voltage is generated by a reference voltage generating circuit provided in the internal voltage generating circuit or POR signal generating circuit and generates the POR signal.

In FIG. 14, reference numeral 30 designates a reference voltage generating circuit for generating a reference voltage on receipt of the external voltage ExVdd, 31 designates a driver connected to the reference voltage generating circuit 30 for outputting a signal by the generation of the reference voltage, and 32 designates a signal generating unit for generating the POR signal from the output of the driver 31.

The reference voltage generating circuit 30 comprises a resistor 33 having a first end connected to a ground potential point GND, and a second end; an N channel MOS transistor 34 having a source connected to the second end of the resistor 33, a gate, and a drain; a P channel MOS transistor 35 having a source to which the external voltage Vdd is given, a drain connected to the drain of the N channel MOS transistor 34, and a gate connected to the drain of the N channel MOS transistor 34; an N channel MOS transistor 36 having a gate connected to the gate of the N channel MOS transistor 34, a source to which the ground potential point GND is given, and a drain connected to the gate of the N channel MOS transistor 34; and a P channel MOS transistor 37 having a drain connected to the drain of the N channel MOS transistor 36, a gate connected to the gate of the P channel MOS transistor 35, and a source to which the external voltage ExVdd is given.

The driver 31 comprises a P channel MOS transistor 38 having a source to which the external voltage ExVdd is given, a gate connected to the gate of the P channel MOS transistor 35, and a drain connected to a node B, and a resistor 39 having a first end connected to the ground potential point GND and a second end connected to the node B.

The signal generating unit 32 comprises an N channel MOS transistor 40 having a source connected to the ground potential point GND, a gate connected to the node B, and a drain; an N channel MOS transistor 41 having a source connected to the ground potential point GND, a gate, and a drain connected to a node C; an inverter 42 which has an input terminal connected to the gate of the N channel MOS transistor 40, and an output terminal connected to the gate of the N channel MOS transistor 41, and delays a signal; a P channel MOS transistor 43 having a source to which the external voltage ExVdd is given, a drain connected to the drain of the N channel MOS transistor 40, and a gate connected to the node C; a P channel MOS transistor 44 having a drain connected to the node C, a gate connected to the drain of the P channel MOS transistor 43, and a source to which the external voltage ExVdd is given; and an inverter 45 having an input terminal connected to the node C, and an output terminal for inverting and outputting a signal input to the input terminal.

The operation of the POR signal generating circuit shown in FIG. 14 will be described below with reference to FIG. 15. When the external voltage ExVdd is raised and exceeds the thresholds of the P channel MOS transistors 35 and 37, a current starts to flow to the reference voltage generating circuit 30. When the current flows to the reference voltage generating circuit 30, the voltage of a node A1 is raised. When the external voltage ExVdd is then raised and becomes higher than the voltage of the node A1 by the threshold of the P channel MOS transistor, the voltage of the node B starts to be raised. When the voltage of the node B exceeds the threshold of the inverter 42 on the next stage, the POR signal is generated. By using the same structure as that of the internal voltage generating circuit 4 or the structure of the internal voltage generating circuit 4 for the reference voltage generating circuit 30, the POR signal can be generated after a power potential on the inside of the semiconductor chip 1 is stabilized.

Figure 16:
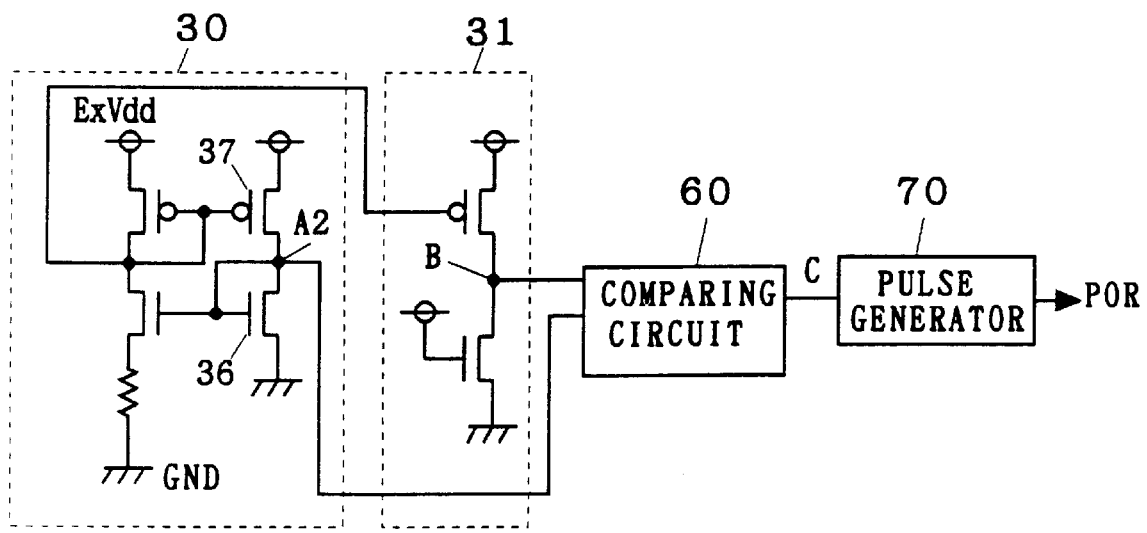
FIG. 16 is a circuit diagram showing a third mode of structure of the internal voltage generating circuit and POR signal generating circuit.

A third mode of the POR signal generating circuit 12 will be described below with reference to FIGS. 16 to 19. FIG. 16 is a block diagram showing the structures of the internal voltage generating circuit and POR signal generating circuit. In FIG. 16, reference numeral 60 designates a comparing circuit for comparing the predetermined node voltage of the reference voltage generating circuit 30 with the output voltage of the driver 31, and 70 designates a pulse generator for generating and outputting a pulse signal according to the timing of the output of the comparing circuit 60.

Figure 18:
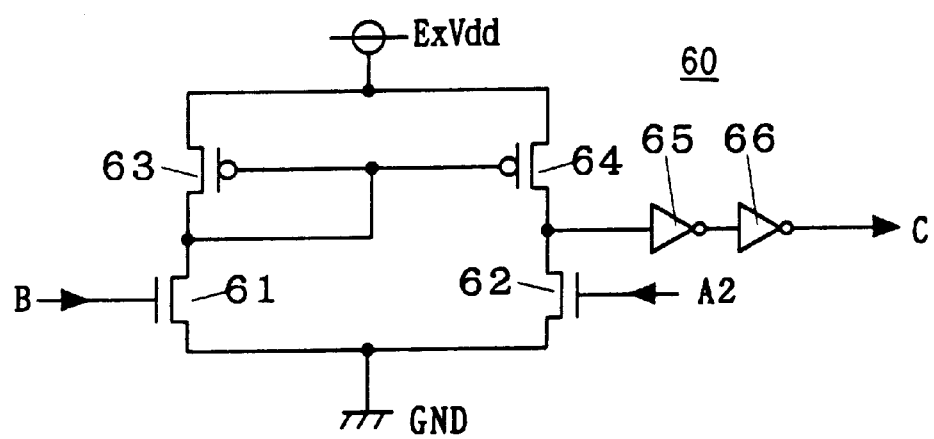
FIG. 18 is a circuit diagram showing the structure of a comparing circuit.

As shown in FIG. 18, the comparing circuit 60 comprises an N channel MOS transistor 61 having a gate connected to the node B, a source connected to a ground potential point GND, and a drain; an N channel MOS transistor 62 having a gate connected to a node A2, a source connected to the ground potential point GND, and a drain; a P channel MOS transistor 63 having a drain connected to the drain of the N channel MOS transistor 61, a gate connected to the drain of the N channel MOS transistor 61, and a source to which the external voltage ExVdd is given; a P channel MOS transistor 64 having a drain connected to the drain of the N channel MOS transistor 62, a gate connected to the gate of the P channel MOS transistor 63, and a source to which the external voltage ExVdd is given; an inverter 65 having an input terminal connected to the drain of the P channel MOS transistor 64, and an output terminal for inverting and outputting a signal received by the input terminal; and an inverter 66 having an input terminal connected to the output terminal of the inverter 65, and an output terminal for inverting and outputting a signal received by the input terminal.

Figure 19:
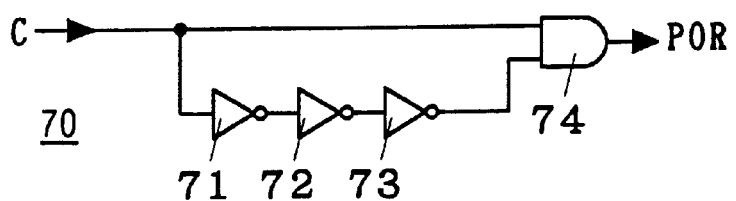
FIG. 19 is a circuit diagram showing the structure of a pulse generator.

As shown in FIG. 19, the pulse generator 70 comprises an inverter 71 having an input terminal for receiving the output of the inverter 66, and an output terminal for inverting and outputting a signal received by the input terminal; an inverter 72 having an input terminal connected to the output terminal of the inverter 71, and an output terminal for inverting and outputting a signal received by the input terminal; an inverter 73 having an input terminal connected to the output terminal of the inverter 72, and an output terminal for inverting and outputting a signal received by the input terminal; and an NAND gate 74 having a first input terminal connected to the node C, a second input terminal connected to the inverter 73, and an output terminal for outputting AND of signals received by the first and second input terminals.

Figure 17:
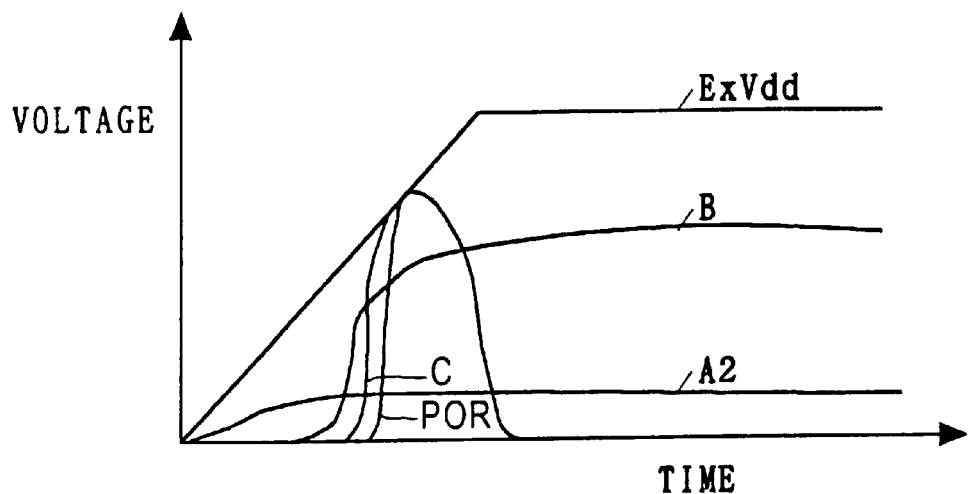
FIG. 17 is a wave form chart showing the operation of the circuit shown in FIG. 16.

The operation of the internal voltage generating circuit and POR signal generating circuit shown in FIG. 16 will be described below with reference to FIG. 17. The comparing circuit 60 for comparing the voltage of the node A2 with that of the node B outputs a high level when the voltage of the node B is higher than that of the node A2. Referring to the circuit shown in FIG. 18, when the voltage of the node B is higher than that of the node A2, the N channel MOS transistor 61 is turned ON more strongly than the N channel MOS transistor 62. Consequently, a current flows to the input terminal of the inverter 65 by means of a current mirror circuit formed by the P channel MOS transistor 63 and the P channel MOS transistor 64 so that the voltage of the output terminal of the inverter 65 is set to a low level. For this reason, the voltage of the output terminal of the inverter 66 is set to a high level.

When the comparing circuit 60 outputs the high level, the pulse generator 70 generates a pulse signal. Referring to the circuit shown in FIG. 19, the first input terminal has the low level while the output of the comparing circuit 60 has the low level. Consequently, the second input terminal connected to the inverter 73 has the high level and the NAND gate 74 outputs the low level. When the output of the comparing circuit 60 is changed from the low level to the high level, the second input terminal of the NAND gate 74 is set to the low level later than the first input terminal of the NAND gate 74 is set to the high level by transmission on the inverters 71 to 73. Consequently, a pulse signal having a pulse width which is equivalent to the delay time is output.

Figure 20:
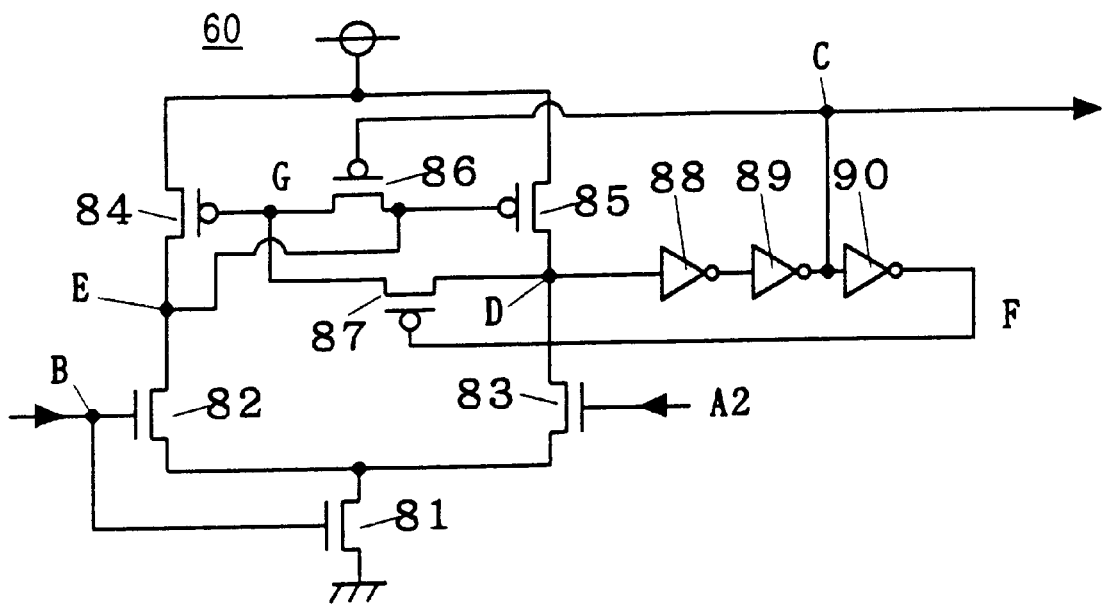
FIG. 20 is a circuit diagram showing another mode of the structure of the comparing circuit.
Figure 21:
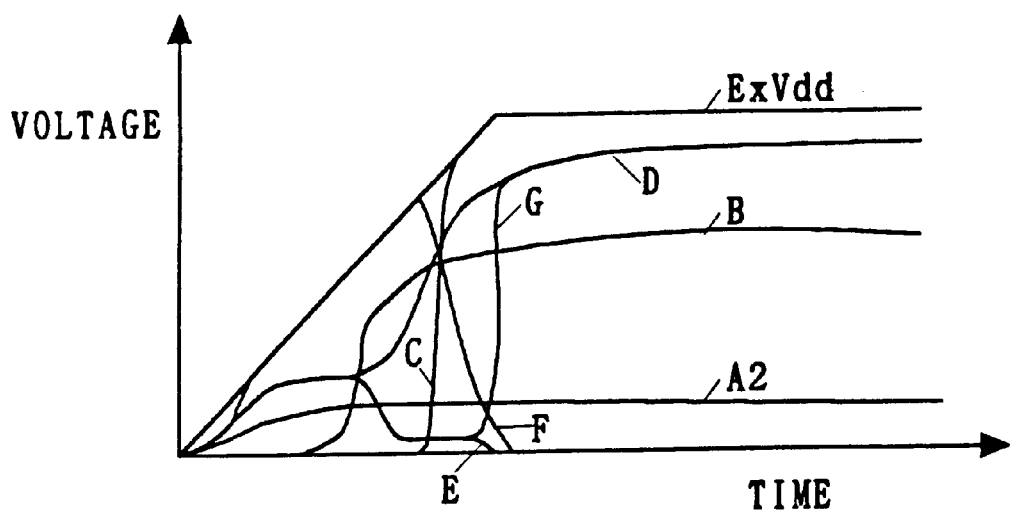
FIG. 21 is a wave form chart showing the operation of the circuit shown in FIG. 20.

A fourth mode of the POR signal generating circuit 12 will be described below with reference to FIGS. 20 and 21. FIG. 20 is a circuit diagram showing another mode of the comparing circuit 60 shown in FIG. 16. In FIG. 16, reference numeral 81 designates an N channel MOS transistor having a source connected to the ground potential point GND, a gate connected to the node B, and a drain, 82 designates an N channel MOS transistor having a source connected to the drain of the N channel MOS transistor 81, a gate connected to the node B, and a drain connected to a node E, 83 designates an N channel MOS transistor having a source connected to the drain of the N channel MOS transistor 81, a gate connected to the node A2, and a drain connected to a node D, 84 designates a P channel MOS transistor having a drain connected to the node E, a source to which the external voltage ExVdd is given, and a gate connected to a node G, 85 designates a P channel MOS transistor having a drain connected to the node D, a source to which the external voltage ExVdd is given, and a gate connected to the node E, 86 designates a transfer gate having a first current electrode connected to the node G, a second current electrode connected to the gate of the P channel MOS transistor 85, and a gate, 87 designates a transfer gate having a first current electrode connected to the node D, a second current electrode connected to the node G, and a gate, 88 designates an inverter having an input terminal connected to the node D, and an output terminal for inverting and outputting the signal of the node D, 89 designates an inverter having an input terminal connected to the output terminal of the inverter 88, and an output terminal connected to the gate of the transfer gate 86, and 90 designates an inverter having an input terminal connected to the output terminal of the inverter 89, and an output terminal connected to the gate of the transfer gate 87.

The operation of the comparing circuit shown in FIG. 20 will be described below with reference to FIG. 21. Since the output terminal of the inverter 89 has a low level, the transfer gate 86 is ON. Since the node D also has the low level, the transfer gate 87 is ON. Immediately after a power source is turned ON, the nodes D, E and G are set to a ground potential (0 V potential). For this reason, the P channel MOS transistors 84 and 85 are ON.

When the external voltage ExVdd is raised, the voltages of the nodes D and E are raised because the P channel MOS transistors 84 and 85 are ON. If the voltages of the nodes D and E exceed the threshold voltages of the P channel MOS transistors 84 and 85, the P channel MOS transistors 84 and 85 are turned OFF so that a rise in voltage of the nodes D and E is almost stopped. The node D is not set to the high level. For this reason, the node C is set to the low level and a node F is set to the high level. The node C has the ground potential, and the voltage of the node F is raised with the external voltage ExVdd.

When the voltage of the node B is raised and becomes higher than that of the node A2, the voltage of the node D is raised and that of the node E is dropped. When the voltage of the node D is raised and exceeds the threshold voltage of the inverter 88, the inverter 88 outputs the low level so that the output of the inverter 89 is set to the high level. Consequently, the transfer gate 86 is turned OFF and the output of the inverter 90 is set to the low level so that the transfer gate 87 is turned ON. Consequently, the P channel MOS transistor 84 is turned OFF and the P channel MOS transistor 85 is turned ON. However, since the gate voltage of the N channel MOS transistor 83 is low, a small amount of current flow is enough. Consequently, a through current can be reduced.

Each POR signal generating circuit described above can be applied to POR signal generating circuits used in second to tenth embodiments.

(Second Embodiment)

Figure 2:
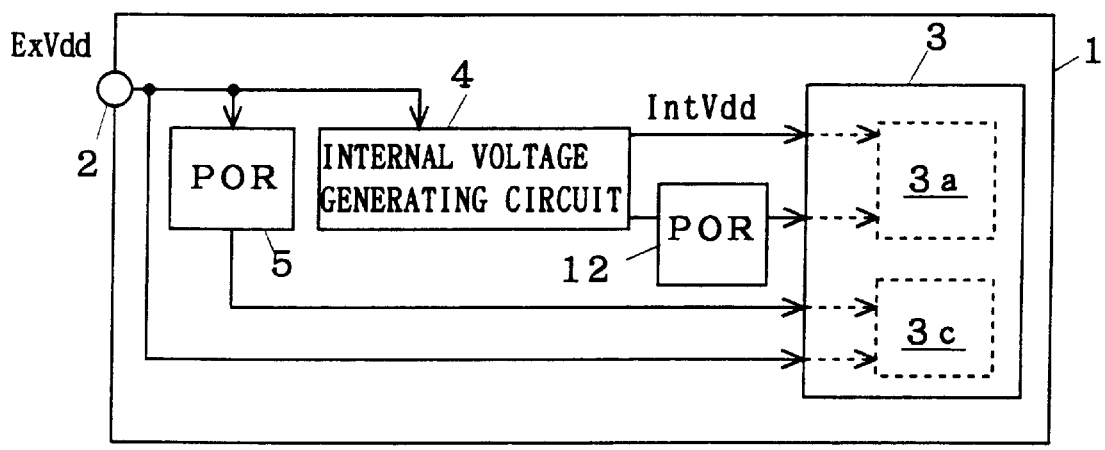
FIG. 2 is a block diagram showing the structure of a semiconductor device according to a second embodiment of the present invention.

FIG. 2 is a block diagram showing the structure of a semiconductor device according to a second embodiment of the present invention. In FIG. 2, reference numeral 5 designates a POR signal generating circuit for generating a POR signal to be given to an internal circuit 3 based on an external voltage ExVdd, and the same reference numbers designate the same units as in FIG. 1. The internal circuit 3 comprises a first circuit unit 3a for operating on receipt of an internal voltage intVdd, and a second circuit unit 3c for operating on receipt of the external voltage ExVdd. For example, the first circuit unit 3a is reset or the start of operation thereof is delayed by a POR signal generating circuit 12, and the second circuit unit 3c is reset or the start of operation thereof is delayed by the POR signal generating circuit 5.

The first and second circuit units 3a and 3c are controlled by the POR signals of the POR signal generating circuits 5 and 12 which are different from each other. Consequently, the operation of the first and second circuit units 3a and 3c can be started at proper timings at which they are stabilized.

(Third Embodiment)

Figure 3:
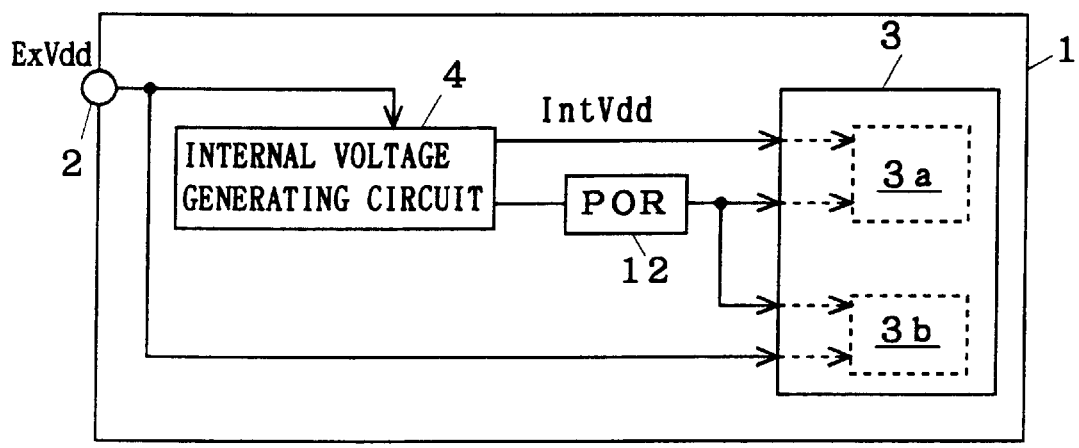
FIG. 3 is a block diagram showing the structure of a semiconductor device according to a third embodiment of the present invention.

FIG. 3 is a block diagram showing the structure of a semiconductor device according to a third embodiment of the present invention. In FIG. 3, the same reference numbers designate the same units as in FIG. 2. The semiconductor device shown in FIG. 3 differs from the semiconductor device shown in FIG. 2 in that the second circuit unit 3c of the semiconductor device shown in FIG. 2 receives the POR signal of the POR signal generating circuit 5 and a second circuit unit 3b of the semiconductor device shown in FIG. 3 receives the POR signal of a POR signal generating circuit 12. If it is sufficient that the operation of the second circuit unit 3b is started after an external voltage ExVdd or internal voltage intVdd is stabilized, the POR signal is sent to the internal circuit 3 and the second circuit unit 3b by the POR signal generating circuit 12 so that the POR signal generating circuit 5 shown in FIG. 2 can be omitted.

(Fourth Embodiment)

Figure 4:
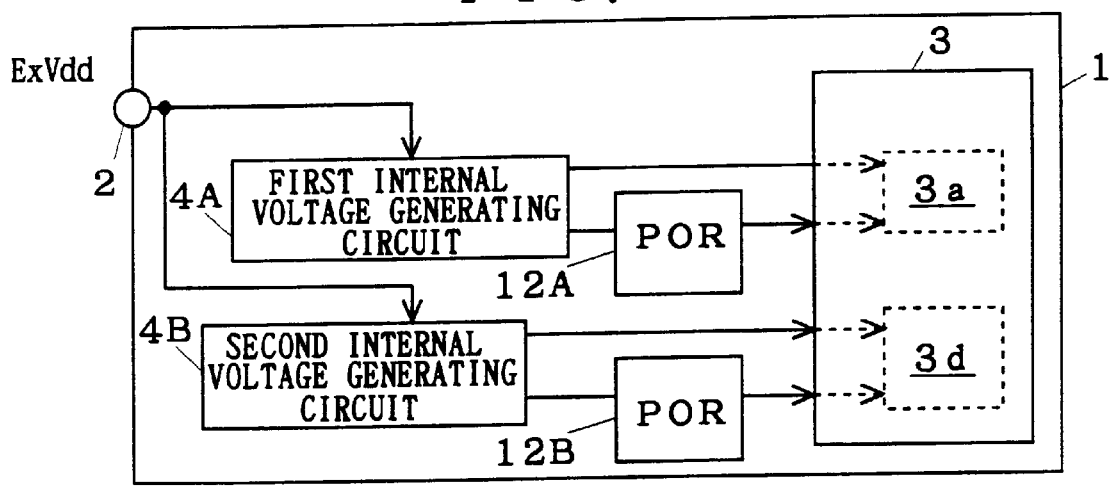
FIG. 4 is a block diagram showing the structure of a semiconductor device according to a fourth embodiment of the present invention.

FIG. 4 is a block diagram showing the structure of a semiconductor device according to a fourth embodiment of the present invention. In FIG. 4, reference numeral 4A designates a first internal voltage generating circuit for supplying a first internal voltage intVdd1 to an internal circuit 3, 4B designates a second internal voltage generating circuit for supplying a second internal voltage intVdd2 to the internal circuit 3, 12A designates a first POR signal generating circuit for generating a first POR signal according to the first internal voltage intVdd1 of the first internal voltage generating circuit 4A, and 12B designates a second POR signal generating circuit for generating a second POR signal according to the second internal voltage intVdd2 of the second internal voltage generating circuit 4B, and the same reference numbers designate the same units as in FIG. 1. The semiconductor device shown in FIG. 4 differs from the semiconductor device shown in FIG. 1 in that the internal circuit 3 comprises a first circuit unit 3a and a fourth circuit unit 3d for operating according to the internal voltages intVdd1 and intVdd2 which are different from each other. In the case where a plurality of internal voltage generating circuits 4A and 4B are provided, POR signals corresponding to respective internal voltage generating circuits are sent to the first and fourth circuit units 3a and 3d to which respective internal voltages intVdd1 and intVdd2 are given so that power-on-reset can be performed more precisely.

(Fifth Embodiment)

Figure 5:
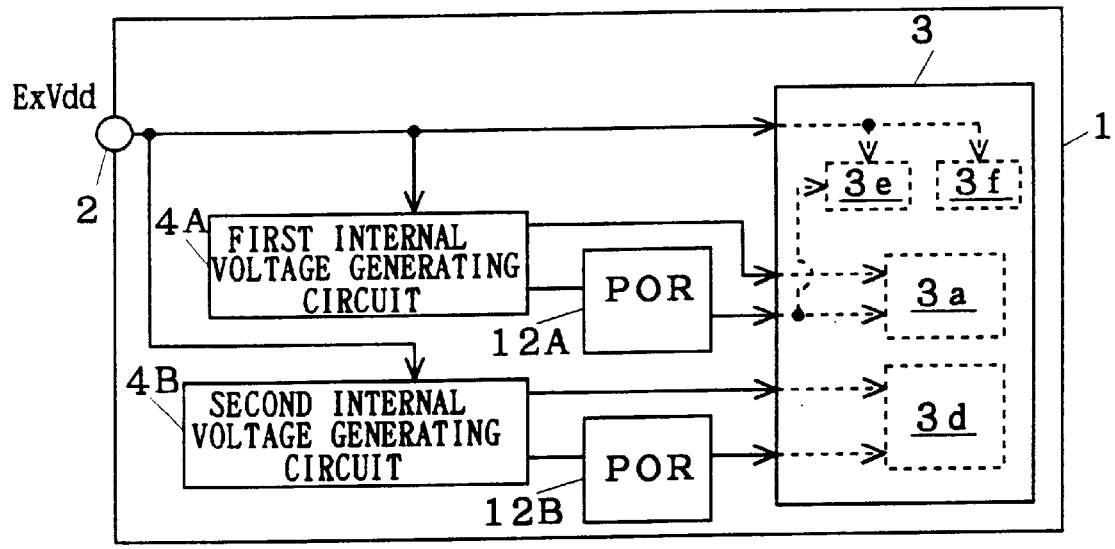
FIG. 5 is a block diagram showing the structure of a semiconductor device according to a fifth embodiment of the present invention.

FIG. 5 is a block diagram showing the structure of a semiconductor device according to a fifth embodiment of the present invention. In FIG. 5, the same reference numbers designate the same units as in FIG. 4. The semiconductor device shown in FIG. 5 differs from the semiconductor device shown in FIG. 4 in that a fifth circuit unit 3e and a sixth circuit unit 3f for operating with an external voltage ExVdd are provided in an internal circuit 3. The fifth circuit unit 3e is reset by the POR signal of a first POR signal generating circuit 12A, and the sixth circuit unit 3f is reset by the POR signal of a second POR signal generating circuit 12B. The circuit units which operate with the same external voltage ExVdd can be reset at different timings so that proper power-on-reset can be performed easily.

(Sixth Embodiment)

Figure 6:
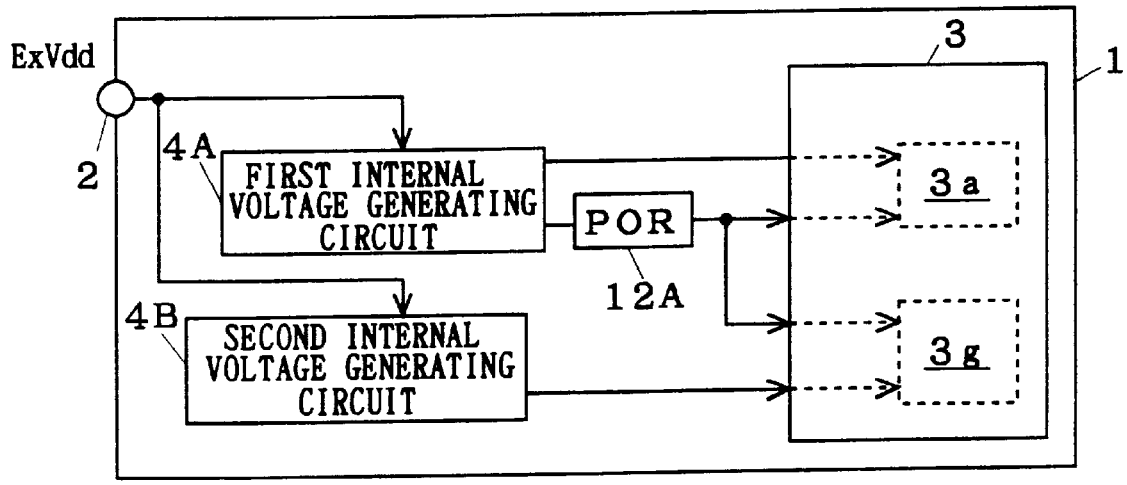
FIG. 6 is a block diagram showing the structure of a semiconductor device according to a sixth embodiment of the present invention.

FIG. 6 is a block diagram showing the structure of a semiconductor device according to a sixth embodiment of the present invention. In FIG. 6, the same reference numbers designate the same units as in FIG. 4. The semiconductor device shown in FIG. 6 differs from the semiconductor device shown in FIG. 4 in that a seventh circuit unit 3g for receiving an internal voltage intVdd from a second internal voltage generating circuit 4B is reset by a first POR signal generating circuit 12A. As shown in FIG. 6, if it is sufficient that the seventh circuit unit 3g operates after the output of a first internal voltage generating circuit 4A is stabilized, the seventh circuit unit 3g can be reset by the first POR signal generating circuit 12A with a second POR signal generating circuit 12B omitted.

(Seventh Embodiment)

Figure 7:
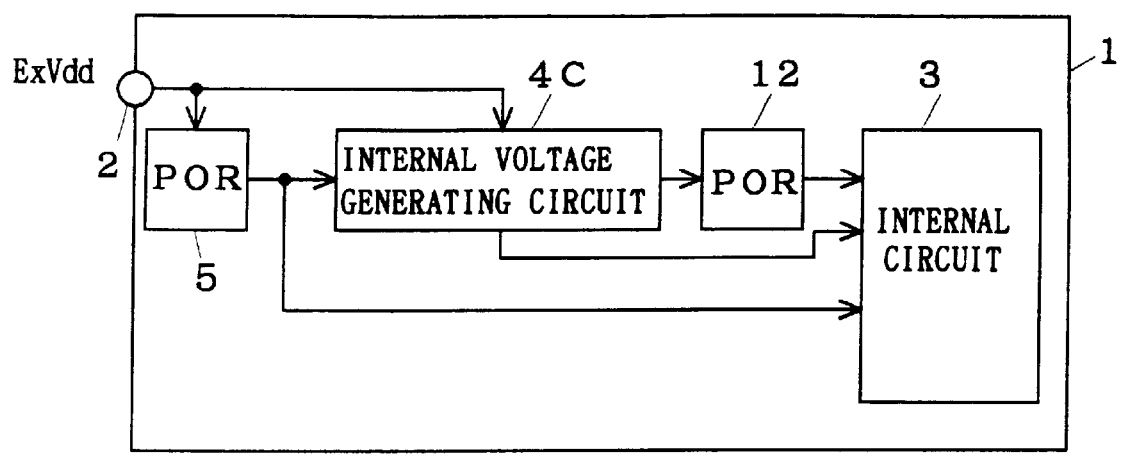
FIG. 7 is a block diagram showing the structure of a semiconductor device according to a seventh embodiment of the present invention.

FIG. 7 is a block diagram showing the structure of a semiconductor device according to a seventh embodiment of the present invention. In FIG. 7, reference numeral 5 designates a POR signal generating circuit for generating a POR signal to be sent to an internal circuit 3 based on an external voltage ExVdd, 4C designates an internal voltage generating circuit which is reset by the POR signal output from the POR signal generating circuit 5, and the same reference numbers designate the same units as in FIG. 1.

Figure 13:
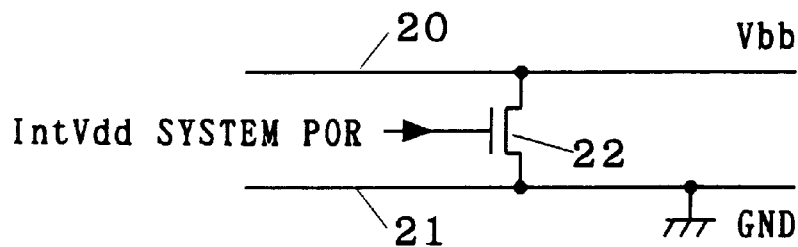
FIG. 13 is a circuit diagram showing means for forming a substrate potential Vbb on a ground potential GND.

In the case of a DRAM, a plurality of potentials such as a substrate potential Vbb, a cell plate potential Vcp and the like are necessary. According to a semiconductor chip in which the external voltage ExVdd is dropped inside and an internal voltage intVdd generated by the dropped external voltage ExVdd is used, the internal voltage generating circuit 4C for giving the cell plate potential Vcp generated by the internal voltage intVdd in which a ground potential GND acts as a reference is reset by the POR signal generating circuit 5, and the substrate potential Vbb is kept fixed to the ground potential GND until the cell plate potential Vcp rises by the POR signal output from a POR signal generating circuit 12 so that the floating of the substrate voltage Vbb can be prevented from occurring. As shown in FIG. 13, a line for supplying the substrate potential Vbb may be connected to a line for supplying the ground potential GND in a transistor 22 having a gate for receiving an internal voltage intVdd system POR signal, or the operation of a circuit itself for giving the substrate potential Vbb may be controlled so as to fix the substrate potential Vbb to the ground potential GND.

Thus, a plurality of POR signals can surely be generated at different timings so that power-on-reset can be performed properly.

(Eighth Embodiment)

Figure 8:
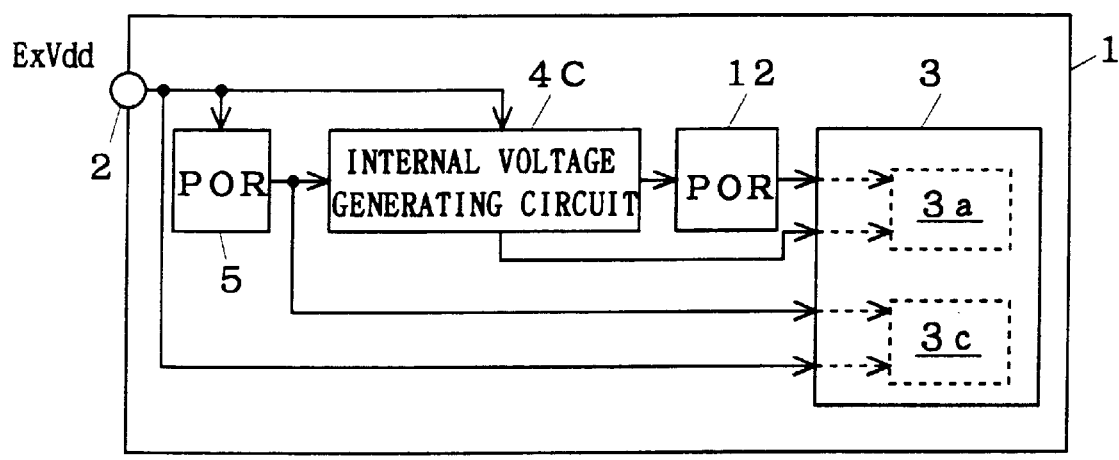
FIG. 8 is a block diagram showing the structure of a semiconductor device according to an eighth embodiment of the present invention.

FIG. 8 is a block diagram showing the structure of a semiconductor device according to an eighth embodiment of the present invention. In FIG. 8, reference numeral 4C designates an internal voltage generating circuit on which power-on-reset is performed by a POR signal generating circuit 5, and the same reference numbers designate the same units as in FIG. 2. The semiconductor device shown in FIG. 8 differs from the semiconductor device shown in FIG. 2 in that the internal voltage generating circuit 4 is different from the internal voltage generating circuit 4C. The same effects as in the seventh embodiment can be obtained.

(Ninth Embodiment)

Figure 9:
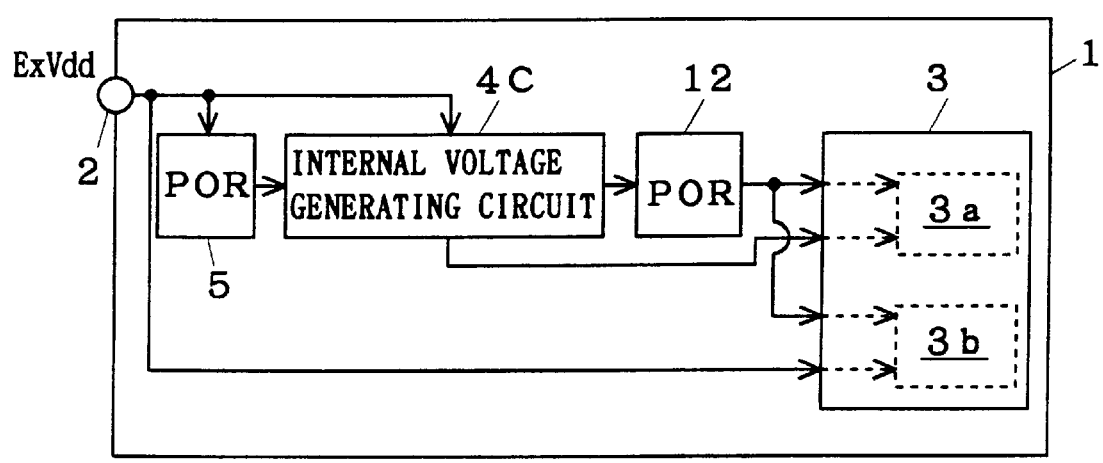
FIG. 9 is a block diagram showing the structure of a semiconductor device according to a ninth embodiment of the present invention.

FIG. 9 is a block diagram showing the structure of a semiconductor device according to a ninth embodiment of the present invention. In FIG. 9, reference numeral 4C designates an internal voltage generating circuit on which power-on-reset is performed by a POR signal generating circuit 5, and the same reference numbers designate the same units as in FIG. 3. The semiconductor device shown in FIG. 9 differs from the semiconductor device shown in FIG. 3 in that the internal voltage generating circuit 4 is different from the internal voltage generating circuit 4C. The same effects as in the seventh embodiment can be obtained.

(Tenth Embodiment)

Figure 10:
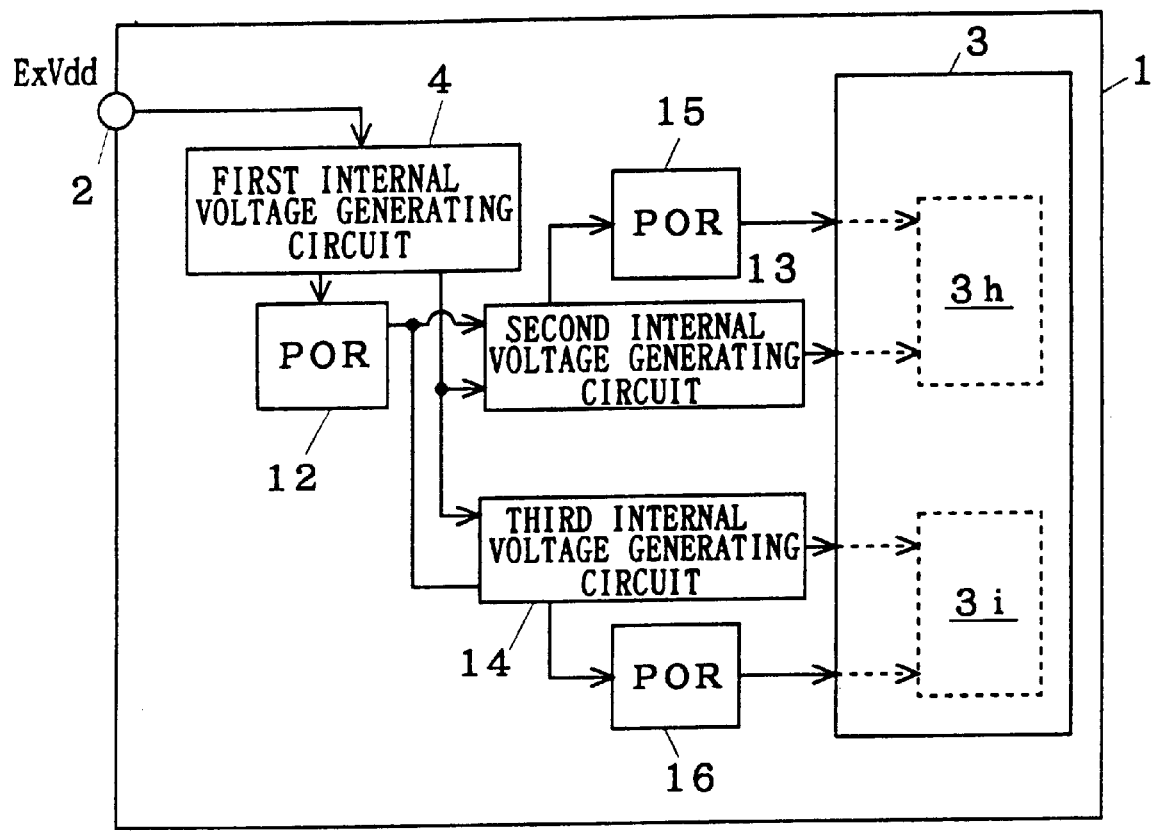
FIG. 10 is a block diagram showing the structure of a semiconductor device according to a tenth embodiment of the present invention.

FIG. 10 is a block diagram showing the structure of a semiconductor device according to a tenth embodiment of the present invention. In FIG. 10, reference numeral 13 designates a second internal voltage generating circuit on which power-on-reset is performed by a POR signal generating circuit 12 on receipt of an internal voltage intVdd from a first internal voltage generating circuit 4, 14 designates a third internal voltage generating circuit on which power-on-reset is performed by the POR signal generating circuit 12 on receipt of the internal voltage intVdd from the first internal voltage generating circuit 4, 15 designates a POR signal generating circuit for generating a POR signal on receipt of an internal voltage intVdd2 of the second internal voltage generating circuit 13, 16 designates a POR signal generating circuit for generating a POR signal on receipt of an internal voltage intVdd3 of the third internal voltage generating circuit 14, 3h designates an eighth circuit unit for receiving the second internal voltage intVdd2 from the second internal voltage generating circuit 13 and for receiving the POR signal from the POR signal generating circuit 15, and 3i designates a ninth circuit unit for receiving the third internal voltage intVdd3 from the third internal voltage generating circuit 14 and for receiving the POR signal from the POR signal generating circuit 16, Power-on-reset is performed on the second internal voltage generating circuit 13 and the third internal voltage generating circuit 14 by the POR signal generating circuit 12 for outputting the POR signal based on the internal voltage output from the first internal voltage generating circuit 4. Consequently, stable operation can be obtained irrespective of the change of an external voltage ExVdd.

The eighth and ninth circuit units 3h and 3i of the internal circuit 3 are hardly influenced by the external voltage because they are generated according to the internal voltages output from the second and third internal voltage generating circuits 13 and 14. In addition, power-on-reset is performed after the internal voltage output from the first internal voltage generating circuit 4 is stabilized. Consequently, a malfunction can be restrained.

(Eleventh Embodiment)

Figure 22:
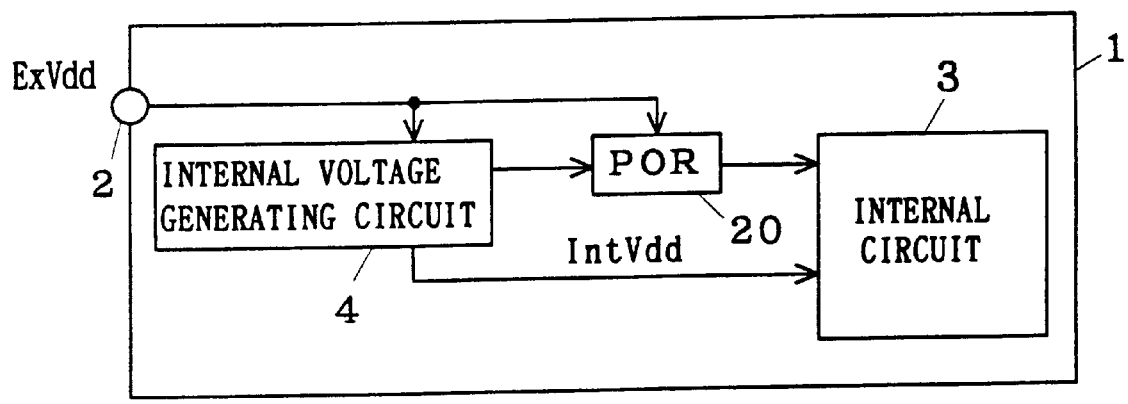
FIG. 22 is a block diagram showing the structure of a semiconductor device according to an eleventh embodiment of the present invention.

FIG. 22 is a block diagram showing the structure of a semiconductor device according to an eleventh embodiment of the present invention. In FIG. 22, 20 designates a POR signal generating circuit for generating a POR signal according to an external voltage ExVdd and an internal voltage intVdd output from an internal voltage generating circuit 4, and the same reference numbers designate the same units as in FIG. 1. The POR signal generating circuit 20 determines a rise timing according to the external voltage ExVdd and a fall time according to the internal voltage intVdd so that a pulse signal is generated.

Figure 24:
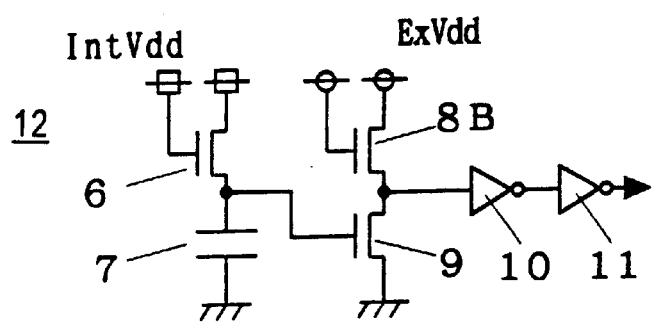
FIG. 24 is a circuit diagram showing the structure of a POR signal generating circuit shown in FIG. 22.

FIG. 24 shows an example of the structure of the POR signal generating circuit 20 shown in FIG. 22. In FIG. 24, reference numeral 6 designates an N channel MOS transistor having a gate to which the internal voltage intVdd is given, a drain to which the internal voltage intVdd is given, and a source, 7 designates a capacitor having a first end connected to the source of the transistor 6, and a second end connected to a ground potential point GND, 8B designates an N channel MOS transistor having a gate to which the external voltage ExVdd is given, a drain to which the external voltage ExVdd is given, and a source, 9 designates an N channel MOS transistor having a drain connected to the source of the transistor 8B, a source connected to the ground potential point GND, and a gate connected to the first end of the capacitor 7, 10 designates an inverter having an input terminal connected to the drain of the transistor 9, and an output terminal for inverting and outputting the logic of a signal input to the input terminal, and 11 designates an inverter having an input terminal connected to the output terminal of the inverter 10, and an output terminal for inverting and outputting the logic of a signal input to the input terminal. The inverters 10 and 11 also operate on receipt of the supply of the external voltage ExVdd.

Electric charges are stored in the capacitor 7 through the N channel MOS transistor 6 with a rise in internal voltage intVdd. Accordingly, the POR signal rises at almost the same timing as that of a rise in intVdd system POR shown in FIG. 12. When a current supplied to the N channel MOS transistor 9 through the N channel MOS transistor 8B is increased and exceeds the threshold of the inverter 10, the output of the inverter 10 is inverted and the output of the inverter 11 is set to a low level. The fall timing of the POR signal is almost the same as that of ExVdd system POR shown in FIG. 12.

Thus, the rise and fall timings are based on the change of different supply voltages so that various kinds of POR signals can be obtained. In addition, it is easy to generate the POR signal corresponding to the internal circuit which operates with a plurality of supply voltages.

(Twelfth Embodiment)

Figure 23:
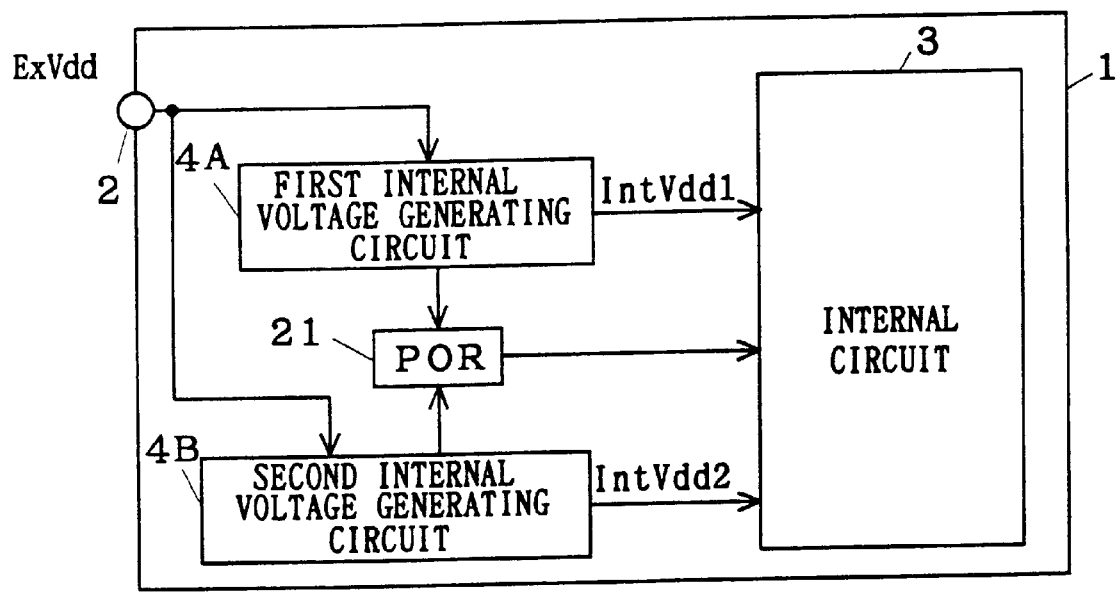
FIG. 23 is a block diagram showing the structure of a semiconductor device according to a twelfth embodiment of the present invention.

FIG. 23 is a block diagram showing the structure of a semiconductor device according to a twelfth embodiment of the present invention. In FIG. 23, reference numeral 21 designates a POR signal generating circuit for generating a POR signal according to internal voltage IntVdd1 and IntVdd2 output from an internal voltage generating circuit 4, and the same reference numbers designate the same units as in FIG. 4. The POR signal generating circuit 21 shown in FIG. 23 determines the rise and fall timings of the POR signal based on internal voltages supplied from first and second internal voltage generating circuits 4A and 4B. The same effects as in the eleventh embodiment can be obtained.

While the invention has been described in detail, the foregoing description is in all aspects illustrative and not restrictive. It is understood that numerous other modifications and variations can be devised without departing from the scope of the invention.

We claim:

1. A semiconductor device comprising:
a power input terminal provided on a semiconductor chip for receiving an external voltage applied from outside said semiconductor chip,
a first internal circuit provided on said semiconductor chip for operating with an internal voltage,
a second internal circuit provided on said semiconductor chip for operating with said external voltage,
an internal voltage generating circuit provided on said semiconductor chip and connected to said power input terminal for generating said internal voltage to be supplied to said first internal circuit based on said external voltage, and
a first reset signal generating circuit provided on said semiconductor chip for generating a first reset signal in response to said internal voltage to reset said first internal circuit or to keep circuit operation of said first internal circuit halted until a first predetermined state is obtained, and
a second reset signal generating circuit provided on said semiconductor chip for generating a second reset signal in response to said external voltage to reset said second internal circuit or to keep circuit operation of said second internal circuit halted until a second predetermined state is obtained.

2. A semiconductor device comprising:
an internal circuit provided on a semiconductor chip,
a power input terminal provided on said semiconductor chip for receiving an external voltage applied from outside said semiconductor chip,
an internal voltage generating circuit provided on said semiconductor chip and connected to said power input terminal for generating an internal voltage to be supplied to said internal circuit based on said external voltage, and
a first reset signal generating circuit provided on said semiconductor chip for generating a first reset signal in response to said internal voltage to reset said internal circuit or to keep circuit operation of said internal circuit halted until a predetermined state is obtained;
a second reset signal generating circuit provided on said semiconductor chip for generating a second reset signal in response to said external voltage,
said internal voltage generating circuit being reset or circuit operation being kept halted until a predetermined state is obtained with said second reset signal.

3. The semiconductor device according to claim 2:
wherein the cell plate potential of a memory cell formed on said semiconductor chip is applied in response to said internal voltage, and a substrate potential of said semiconductor chip is applied in response to said external voltage.

4. A semiconductor device comprising:
an internal circuit provided on a semiconductor chip,
a power input terminal provided on said semiconductor chip for receiving an external voltage applied from outside said semiconductor chip,
a first internal voltage generating circuit provided on said semiconductor chip and connected to said power input terminal for generating a first internal voltage to be supplied to said internal circuit based on said external voltage,
a first reset signal generating circuit provided on said semiconductor chip for generating a first reset signal in response to said first internal voltage,
a second internal voltage generating circuit provided on said semiconductor chip for generating a second internal voltage used in said internal circuit based on said first internal voltage supplied from said first internal voltage generating circuit, said second internal voltage generating circuit responsive to said first reset signal for being reset or kept halted until a first predetermined state is obtained, and
a second reset signal generating circuit provided on said semiconductor chip for generating a second reset signal in response to said second internal voltage to reset said internal circuit or keep circuit operation of said internal circuit halted until a second predetermined state is obtained.

5. A semiconductor device comprising:
an internal circuit provided on a semiconductor chip,
a power input terminal provided on said semiconductor chip for receiving an external voltage applied from outside said semiconductor chip,
an internal voltage generating circuit provided on said semiconductor chip and connected to said power input terminal for generating an internal voltage to be supplied to said internal circuit based on said external voltage,
a reset signal generating circuit provided on said semiconductor chip for generating, in response to said external voltage and said internal voltage, a reset signal to reset said internal circuit or to keep circuit operation of said internal circuit halted until a predetermined state is obtained,
wherein said internal voltage is defined by first and second potentials and said external voltage is defined by said second potential and a third potential,
said reset signal generating circuit comprising:
a first insulated-gate transistor having a control electrode to which said first potential is applied, a first current electrode to which said first potential is applied, and a second current electrode,
a capacitor having a first electrode to which said second potential is applied, and a second electrode connected to said second current electrode of said first insulated-gate transistor,
a second insulated-gate transistor having a control electrode to which said third potential is applied, a first current electrode to which said third potential is applied, and a second current electrode, and having the same conductivity type as that of said first insulated-gate transistor,
a third insulated-gate transistor having a first current electrode to which said second potential is applied, a control electrode connected to said second current electrode of said first insulated-gate transistor, and a second current electrode connected to said second current electrode of said second insulated-gate transistor, and having the same conductivity type as that of said first insulated-gate transistor, a first inverter having an input terminal connected to said second current electrode of said second insulated-gate transistor, and an output terminal, and a second inverter having an input terminal connected to said output terminal of said first inverter, and an output terminal for outputting said reset signal.

6. A semiconductor device comprising:

an internal circuit provided on a semiconductor chip, a power input terminal provided on said semiconductor chip for receiving an external voltage applied from outside said semiconductor chip, a first internal voltage generating circuit provided on said semiconductor chip and connected to said power input terminal for generating a first internal voltage to be supplied to said internal circuit based on said external voltage, a second internal voltage generating circuit provided on said semiconductor chip and connected to said power input terminal for generating a second internal voltage to be supplied to said internal circuit based on said external voltage, and a reset signal generating circuit provided on said semiconductor chip for generating a reset signal in response to said first and second internal voltages to reset said internal circuit or to keep circuit operation of said internal circuit halted until a predetermined state is obtained;

wherein said reset signal generating circuit is configured for generating said reset signal having the shape of a pulse with rise and fall timings that are responsive, respectively, to said first and second internal voltages.

7. The semiconductor device according to claim 6, wherein said first internal voltage is defined by first and second potentials and said second internal voltage is defined by said second potential and a third potential, said reset signal generating circuit comprising:

a first insulated-gate transistor having a control electrode to which said first potential is applied, a first current electrode to which said first potential is applied, and a second current electrode, a capacitor having a first electrode to which said second potential is applied, and a second electrode connected to said second current electrode of said first insulated-gate transistor, a second insulated-gate transistor having a control electrode to which said third potential is applied, a first current electrode to which said third potential is applied, and a second current electrode, and having the same conductivity type as that of said first insulated-gate transistor, a third insulated-gate transistor having a first current electrode to which said second potential is applied, a control electrode connected to said second current electrode of said first insulated-gate transistor, and a second current electrode connected to said second current electrode of said second insulated-gate transistor, and having the same conductivity type as that of said first insulated-gate transistor, a first inverter having an input terminal connected to said second current electrode of said second insulated-gate transistor, and an output terminal, and a second inverter having an input terminal connected to said output terminal of said first inverter, and an output terminal for outputting said reset signal.

8. A semiconductor device comprising:

an internal circuit provided on a semiconductor chip, a power input terminal provided on said semiconductor chip for receiving an external voltage applied from outside said semiconductor chip, an internal voltage generating circuit provided on said semiconductor chip and connected to said power input terminal for generating an internal voltage to be supplied to said internal circuit based on said external voltage, and a first reset signal generating circuit provided on said semiconductor chip for generating a reset signal in response to said internal voltage to reset said internal circuit or to keep circuit operation of said internal circuit halted until a predetermined state is obtained;

wherein said first reset signal generating circuit comprises:

comparing means for comparing the voltages of two predetermined nodes in said internal voltage generating circuit, and reset signal generating means for generating said reset signal in response to the results of comparison obtained by said comparing means.

9. The semiconductor device according to claim 8, wherein said comparing means comprises:

a first transistor of a first conductivity type having a first current electrode connected to a first power potential point, a control electrode connected to a first input terminal, and a second current electrode, a second transistor of the first conductivity type having a control electrode connected to said first input terminal, a first current electrode connected to said second current electrode of said first transistor, and a second current electrode, a third transistor of the first conductivity type having a first current electrode connected to said second current electrode of said first transistor, a control electrode connected to a second input terminal, and a second current electrode, a fourth transistor of a second conductivity type having a first current electrode connected to a second power potential point, a control electrode, and a second current electrode connected to said second current electrode of said second transistor, a fifth transistor of the second conductivity type having a first current electrode connected to said second power potential point, a control electrode connected to said second current electrode of said fourth transistor, and a second current electrode connected to said second current electrode of said third transistor, a sixth transistor of the second conductivity type having a first current electrode connected to said control electrode of said fourth transistor, a second current electrode connected to said control electrode of said fifth transistor, and a control electrode, a seventh transistor of the second conductivity type having a first current electrode connected to said control electrode of said fourth transistor, a second current electrode connected to said second current electrode of said third transistor, and a control electrode, a first inverter having an input terminal connected to said second current electrode of said third transistor, and an output terminal, a second inverter having an input terminal connected to said output terminal of said first inverter, and an output terminal connected to said control electrode of said sixth transistor, and a third inverter having an input terminal connected to said output terminal of said second inverter, and an output terminal connected to said control electrode of said seventh transistor, wherein the results of comparison are output from said output terminal of said second inverter.

10. A semiconductor device comprising:

an internal circuit provided on a semiconductor chip, a power input terminal provided on said semiconductor chip for receiving an external voltage applied from outside said semiconductor chip, an internal voltage generating circuit provided on said semiconductor chip and connected to said power input terminal for generating an internal voltage to be supplied to said internal circuit based on said external voltage, and a reset signal generating circuit provided on said semiconductor chip for generating a reset signal in response to said internal voltage to reset said internal circuit or to keep circuit operation of said internal circuit halted until a predetermined state is obtained;

wherein said internal voltage produced by said internal voltage generating circuit is defined by first and second potentials, said reset signal generating circuit comprising:

a first insulated-gate transistor having a control electrode to which said first potential is applied, a first current electrode to which said first potential is applied, and a second current electrode, a capacitor having a first electrode to which said second potential is applied, and a second electrode connected to said second current electrode of said first insulated-gate transistor, a second insulated-gate transistor having a control electrode to which said first potential is applied, a first current electrode to which said first potential is applied, and a second current electrode, and having the same conductivity type as that of said first insulated-gate transistor, a third insulated-gate transistor having a first current electrode to which said second potential is applied, a control electrode connected to said second current electrode of said first insulated-gate transistor, and a second current electrode connected to said second current electrode of said second insulated-gate transistor, and having the same conductivity type as that of said first insulated-gate transistor, a first inverter having an input terminal connected to said second current electrode of said second insulated-gate transistor and an output terminal, and operating with said internal voltage, and a second inverter having an input terminal connected to said output terminal of said first inverter and an output terminal for outputting said reset signal, and operating with said internal voltage.

11. A semiconductor device comprising:

an internal circuit provided on a semiconductor chip, a power input terminal provided on said semiconductor chip for receiving an external voltage applied from outside said semiconductor chip, internal voltage generating circuitry provided on said semiconductor chip and connected to said power input terminal for generating an internal voltage to be supplied to said internal circuit based on said external voltage, and a reset signal generating circuit provided on said semiconductor chip for generating a reset signal in response to a reference level of said internal voltage to reset said internal circuit or to keep circuit operation of said internal circuit halted until a predetermined state is obtained;

wherein said internal voltage generating circuitry comprises:

a reference voltage generating circuit for generating a reference voltage representing said reference level of said internal voltage, and said reset signal generating circuit comprises:

a driver for detecting that the potential of a predetermined node of said reference voltage generating circuit reaches a predetermined potential, and a reset signal generating unit for generating said reset signal in response to the output signal of said driver.

12. The semiconductor device according to claim 11, wherein said external voltage is defined by first and second potentials, said driver comprises:

a first insulated-gate transistor having a gate connected to said predetermined node, a source to which said first potential is applied, and a drain, and resistor means having a first end connected to said drain of said first insulated-gate transistor, and a second end to which said second potential is applied, and said reset signal generating unit comprises:

a first inverter having an input terminal connected to said first end of said resistor means and an output terminal for inverting and outputting a signal sent from said input terminal, and operating by said external voltage, a second insulated-gate transistor having a source to which said second potential is applied, a gate connected to said first end of said resistor means, and a drain, a third insulated-gate transistor having a source to which said second potential is applied, a gate connected to said output terminal of said first inverter, and a drain, a fourth insulated-gate transistor having a drain connected to said drain of said second insulated-gate transistor, a gate connected to said drain of said third insulated-gate transistor, and a source to which said first potential is applied, a fifth insulated-gate transistor having a gate connected to said drain of said fourth insulated-gate transistor, a source to which said first potential is applied, and a drain connected to said gate of said fourth insulated-gate transistor, and a second inverter having an input terminal connected to said drain of said fifth insulated-gate transistor, and an output terminal for outputting said reset signal.

* * * * *